(12) United States Patent
Van Aert et al.

(10) Patent No.: US 9,985,155 B2
(45) Date of Patent: May 29, 2018

(54) BACKSHEET FOR PHOTOVOLTAIC MODULES

(71) Applicant: AGFA GEVAERT, Mortsel (BE)

(72) Inventors: Hubertus Van Aert, Mortsel (BE); Geert Vercruysse, Mortsel (BE); Simon McKie, Mortsel (BE)

(73) Assignee: AGFA-GEVAERT, Mortsel (BE)

( * ) Notice: Subject to any disclaimer, the term of this patent is extended or adjusted under 35 U.S.C. 154(b) by 321 days.

(21) Appl. No.: 14/895,291

(22) PCT Filed: Jun. 26, 2014

(86) PCT No.: PCT/EP2014/063573
§ 371 (c)(1),
(2) Date: Dec. 2, 2015

(87) PCT Pub. No.: WO2015/003920
PCT Pub. Date: Jan. 15, 2015

(65) Prior Publication Data
US 2016/0126384 A1    May 5, 2016

(30) Foreign Application Priority Data

Jul. 9, 2013   (EP) .................................... 13175708

(51) Int. Cl.
*B32B 27/00*    (2006.01)
*B32B 27/08*    (2006.01)
(Continued)

(52) U.S. Cl.
CPC ........ *H01L 31/049* (2014.12); *B29C 47/0021* (2013.01); *B29C 47/887* (2013.01); *B29C 47/8845* (2013.01); *C08G 18/6229* (2013.01); *C08G 18/792* (2013.01); *C09D 133/066* (2013.01); *C09D 133/14* (2013.01);
(Continued)

(58) Field of Classification Search
CPC .............. C09D 133/066; C09D 175/04; C09D 133/14; H01L 31/049; H01L 31/0481; C08G 18/6229; C08G 18/792; B29C 47/887; B29C 47/0021; B29C 47/8845; B29C 47/0057; Y02E 10/50;
(Continued)

(56) References Cited

U.S. PATENT DOCUMENTS

| | | | |
|---|---|---|---|
| 2009/0151774 A1 | 6/2009 | Depine et al. | |
| 2012/0048352 A1* | 3/2012 | Nagato | C08G 18/6279 136/251 |
| 2012/0227795 A1* | 9/2012 | Kameda | C08J 7/08 136/252 |

FOREIGN PATENT DOCUMENTS

| | | |
|---|---|---|
| JP | 2006-179557 A | 7/2006 |
| JP | 2012-81742 A | 4/2012 |

OTHER PUBLICATIONS

Official Communication issued in International Patent Application No. PCT/EP2014/063573, dated Sep. 1, 2014.

* cited by examiner

*Primary Examiner* — William K Cheung
(74) *Attorney, Agent, or Firm* — Keating and Bennett, LLP

(57) ABSTRACT

A backsheet for a photovoltaic module includes a support and a primer provided on a side of the support facing a sealing layer, the primer including an acrylic resin and a crosslinking agent, characterized in that the acrylic resin is a copolymer including at least 5 wt % of an acrylate monomer unit containing a UV absorbing group and at least 2 wt % of an acrylate monomer unit containing a crosslinkable group both relative to the total weight of monomer units.

15 Claims, 2 Drawing Sheets

A schematic representation of a photovoltaic module

(51) Int. Cl.
  *B32B 27/30* (2006.01)
  *C08F 290/06* (2006.01)
  *B05D 1/00* (2006.01)
  *H02N 6/00* (2006.01)
  *H01L 31/049* (2014.01)
  *C09D 133/06* (2006.01)
  *C09D 133/14* (2006.01)
  *C08G 18/62* (2006.01)
  *C08G 18/79* (2006.01)
  *C09D 175/04* (2006.01)
  *B29C 47/00* (2006.01)
  *B29C 47/88* (2006.01)
  *H01L 31/048* (2014.01)

(52) U.S. Cl.
  CPC ........ *C09D 175/04* (2013.01); *H01L 31/0481* (2013.01); *B29C 47/0057* (2013.01); *Y02E 10/50* (2013.01)

(58) Field of Classification Search
  CPC ...... C08F 2220/1841; C08F 2220/1825; C08F 220/20; C08F 220/36
  USPC ......... 428/515, 421, 522; 524/558; 136/251; 427/209
  See application file for complete search history.

FIGURE 1: A schematic representation of a photovoltaic module
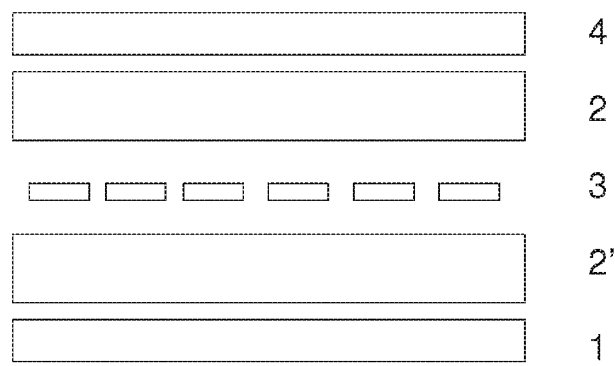
FIGURE 2: A schematic represenation of an embodiment of a back sheet
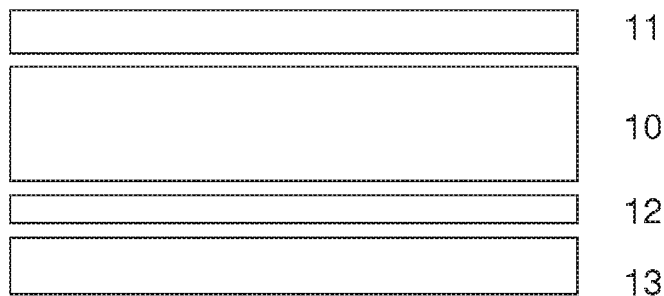

FIGURE 3: A schematic representation of an embodiment of an "integrated" back sheet.
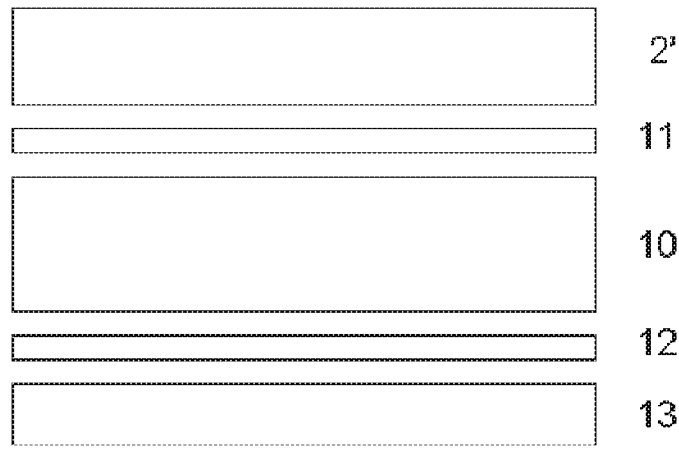

BACKSHEET FOR PHOTOVOLTAIC MODULES

CROSS-REFERENCE TO RELATED APPLICATIONS

This application is a 371 National Stage Application of PCT/EP2013/063573, filed Jun. 26, 2014. This application claims the benefit of European Application No. 13175708.0, filed Jul. 9, 2013, which is also incorporated by reference herein in its entirety.

BACKGROUND OF THE INVENTION

1. Field of the Invention

The invention relates to a backsheet for a photovoltaic module and to a method to prepare such a backsheet.

2. Description of the Related Art

With increasing energy prices and increasing concern over the scarcity and the environmental impact of hydrocarbon fuels, industry is turning to alternative energy sources, such as solar energy.

Photovoltaic (PV) modules, also known as solar modules, are used to produce electrical energy from sunlight. Such modules are based on a variety of semiconductor cell systems (the solar cell) that can absorb light and convert it into electrical energy.

In a typical PV module, the solar cell arrays are positioned between two encapsulant layers, which are further positioned between a front sheet (upper side of the module facing the incoming light) and a backsheet (back side of the module). The most widely used encapsulant is EVA, i.e. Ethylene Vinyl Acetate.

The backsheet provides weather resistance, UV resistance, moisture barrier properties, low dielectric constant and a high breakdown voltage to the solar cell module. To provide such properties to the PV module, a backsheet comprises a weather resistant film, for example a Tedlar™ film, and/or a polyethyleneterephthalate (PET) film. For example a TPT type backsheet, wherein a Tedlar™ film is laminated on both sides of a PET film, or a TPE type backsheet, wherein a Tedlar™ is laminated on one side of a PET film, while on the other side an encapsulant adhesion layer is provided, are nowadays widely used as backsheet on the market.

Instead of laminating a weather resistant sheet on a support it may be advantageous to coat a weather resistant layer on a support, for example to decrease the cost price of the backsheet. Such a weather resistant layer may be coated from an aqueous or a non-aqueous coating solution. US2009/0151774 for example discloses a backsheet wherein the weather resistant layer is coated on a plastic support instead of laminated.

A backsheet is typically laminated to a sealing layer, also referred to as encapsulant layer. For this reason, the adhesion of the backsheet to such a sealing layer has to be sufficiently good. To improve the adhesion, a primer may be provided on that side of a support facing the sealing layer.

SUMMARY OF THE INVENTION

Preferred embodiments of the present invention provide a backsheet for a PV module, wherein the backsheet, while providing sufficient or even improved weather resistance, UV resistance and moisture barrier properties to the PV module, is characterized by a sufficient adhesion towards a sealing or encapsulant layer. The advantages and benefits are realized by a backsheet as defined below.

Another preferred embodiment of the present invention provides a method of preparing such a backsheet.

Further advantages and embodiments of the present invention will become apparent from the following description below.

BRIEF DESCRIPTION OF THE DRAWINGS

FIG. 1 shows a schematic representation of an embodiment of a photovoltaic module according to the present invention.

FIG. 2 shows a schematic representation of an embodiment of a backsheet according to the present invention.

FIG. 3 shows a schematic representation of an embodiment of an "integrated" backsheet according to the present invention.

DETAILED DESCRIPTION OF THE PREFERRED EMBODIMENTS

The present invention relates to a backsheet (1) for a photovoltaic module (5) comprising a support (10) and a primer (11) provided on a side of the support facing a sealing layer (2'), the primer comprising an acrylic resin and a crosslinking agent, characterized in that the acrylic resin is a copolymer comprising at least 5 wt % of an acrylate monomer unit containing a UV absorbing group and at least 2 wt % of an acrylate monomer unit containing a crosslinkable group both relative to the total weight of monomer units.

The backsheet preferably also comprises a weather resistant layer (13) comprising a binder containing a crosslinkable group and an isocyanate crosslinking agent.

Primer

A primer (11) according to a preferred embodiment of the present invention is provided on a side of a support (10) facing a sealing layer (2'). The primer comprises an acrylic resin and a crosslinking agent.

Acrylic Resin

The acrylic resin is a copolymer comprising at least 5 wt % of an acrylate monomer unit containing a UV absorbing group and at least 2 wt % of an acrylate monomer unit containing a crosslinkable group both relative to the total weight of monomer units.

The acrylic resin is preferably prepared by copolymerizing acrylate monomers of which at least 5 wt % is an acrylate monomer containing a UV absorbing group and at least 2 wt % is an acrylate monomer containing a crosslinkable group both relative to the total weight of acrylate monomers.

In addition to an acrylate monomer unit comprising an UV absorbing group and an acrylate monomer unit comprising a crosslinkable group other acrylate monomers may be used to prepare the acrylic resin. The acrylic resin preferably also comprises alicylic acrylate monomer unit and an acrylate monomer unit containing a HALS group.

By copolymerizing the UV absorber and optionally the HALS compound, bleed-out of these compounds to the surface of the primer when exposed to high temperature, for example when laminating the backsheet to sealing layer, is avoided. Such a bleed-out may happen when a UV absorbing compound or a HALS compound is added or mixed with an acrylic resin and may result in changes in adhesion of the primer towards the sealing layer.

Acrylate Monomer Unit Containing an UV Absorbing Group

The acrylic resin is a copolymer comprising at least 5 wt %, preferably at least 7.5 wt %, more preferably at least 10 wt %, most preferably at least 20 wt % of an acrylate monomer unit containing a UV absorbing group.

Examples of acrylate monomer units containing an UV absorbing group may be acrylate monomer units containing a benzotriazol group, a benzophenone group or triazine group.

Examples of benzotriazol containing acrylates include 2-[2'-hydroxy-5'-(methacryloyloxy-methyl)phenyl]-2H-benzotriazol, 2-[2'-hydroxy-5'-(methacryloyloxy-ethyl) phenyl]-2H-benzotriazol, 2-[2'-hydroxy-3'-tert-butyl-5'-(methacryloyloxy-ethyl) phenyl]-2H-benzotriazol, 2-[2'-hydroxy-5'-tert-butyl-3'-(methacryloyloxy-ethyl) phenyl]-2H-benzotriazol, 2-[2'-hydroxy-5'-(methacryloyloxy-ethyl) phenyl]-5-chloro-2H-benzotriazol, 2-[2'-hydroxy-5'-(methacryloyloxy-ethyl) phenyl]-5-methoxy-2H-benzotriazol, 2-[2'-hydroxy-3'-(meta) acryloylamino 5'-(1,1,3,3-tetrametylbutyl) phenyl]-2H-benzotriazol, 2-[2'-hydroxy-3'-(meta) acryloylamino methyl-5'-(1,1,3,3-tetrametylbutyl)phenyl]-2H-benzotriazol, 2-[2'-hydroxy-3'-(meta) acryloyl amino-phenyl]-2H-benzotriazol, 2-[2'-hydroxy-3'-(meta) acryloylamino methylphenyl]-2H-benzotriazol.

Examples of benzophenone containing acrylates include 2-hydroxy-4-[2-(meth) acryloyloxy]ethoxybenzophenone, 2-hydroxy-4-[2-(meth)acryloyloxy]butoxybenzophenone, 2,2'-dihydroxy-4-[2-(meth)acryloyloxy]ethoxybenzophenone, 2-hydroxy-4-[2-(meth) acryloyloxy]ethoxy-4'-(2-hydroxyethoxy) benzophenone, 2-hydroxy-3-tert-butyl-4-[2-(meth)acryloyloxy]ethoxybenzophenone and 2-hydroxy-3-tert-butyl-4-[2-(meth)acryloyloxy]butoxybenzophenone.

Examples of triazine containing acrylates include 2-[2-hydroxy-4-(2-methacryloyl oxyethoxy) phenyl]-4,6-diphenyl-1,3,5-triazine, 2,4-diphenyl-6-[2-hydroxy-4-(2-acryloyloxy)phenyl]-1,3,5-triazine, 2,4-bis(2-methylphenyl)-6-[2-hydroxy-4-(2-acryloyl oxyethoxy) phenyl]-1,3,5-triazine, 2,4-bis(2-methoxypheny)-6-[2-hydroxy-4-(2-acryloyl oxyethoxy) phenyl]-1,3,5-triazine, 2,4-bis(2-ethylphenyl)-6-[2-hydroxy-4-(2-acryloyl oxyethoxy) phenyl]-1,3,5-triazine, 2,4-bis(2-ethoxyphenyl)-6-[2-hydroxy-4-(2-acryloyl oxyethoxy) phenyl]-1,3,5-triazine, 2,4-diphenyl-6-[2-hydroxy-4-(2-methacryloyl oxyethoxy) phenyl]-1,3,5-triazine, 2,4-bis(2-methylphenyl)-6-[2-hydroxy-4-(2-methacryloyl oxyethoxy) phenyl]-1,3,5-triazine, 2,4-bis(2-methoxypheny)-6-[2-hydroxy-4-(2-methacryloyl oxyethoxy) phenyl]-1,3,5-triazine, 2,4-bis(2-ethyl-phenyl)-6-[2-hydroxy-4-(2-methacryloyl oxyethoxy) phenyl]-1,3,5-triazine, 2,4-bis(2-ethoxyphenyl)-6-[2-hydroxy-4-(2-methacryloyl oxyethoxy) phenyl]-1,3,5-triazine, 2,4-bis(2,4-dimethoxyphenyl)-6-[2-hydroxy-4-(2-acryloyl oxyethoxy) phenyl]-1,3,5-triazine, 2,4-bis(2,4-dimethylphenyl)-6-[2-hydroxy-4-(2-acryloyl oxyethoxy) phenyl]-1,3,5-triazine, 2,4-bis(2,4-diethoxyphenyl)-6-[2-hydroxy-4-(2-acryloyl oxyethoxy) phenyl]-1,3,5-triazine, 2,4-bis(2,4-diethylphenyl)-6-[2-hydroxy-4-(2-acryloyl oxyethoxy) phenyl]-1,3,5-triazine, 2-[2-hydroxy-4-(11-acryloyloxy undecyloxy) phenyl]-4,6-diphenyl-1,3,5-triazine, 2-[2-hydroxy-4-(11-methacryloyloxy undecyloxy) phenyl]-4,6-diphenyl-1,3,5-triazine, and 2-[2-hydroxy-4-(11-acryloyloxy undecyloxy) phenyl]-4,6-bis(2,4-dimethylphenyl)-1,3,5-triazine.

Particularly preferred UV-curable monomers are benzothiazolylidene derivatives such as: 2-methyl-2-Propenoic acid 2-[2-methoxy-4-[[2-(3-methyl-2(3H)-benzothiazolylidene)hydrazinylidene]methyl]phenoxy]ethyl ester, 2-methyl-2-Propenoic acid 2-[3-methoxy-4-[[2-(3-methyl-2(3H)-benzothiazolylidene)hydrazinylidene]methyl]phenoxy]ethyl ester, 2-methyl-2-Propenoic acid 2-methoxy-4-[[2-(3-methyl-2(3H)-benzothiazolylidene)hydrazinylidene]methyl]phenyl ester, 2-methyl-2-Propenoic acid 2-[4-[1-[2-(3-methyl-2(3H)-benzothiazolylidene)hydrazinylidene]ethyl]phenoxy]ethyl ester, 4-[[2-(3-methyl-2(3H)-benzothiazolylidene)hydrazinylidene]methyl]-Benzoic acid 2-[(2-methyl-1-oxo-2-propen-1-yl)oxy]ethyl ester, 2-methyl-2-Propenoic acid 4-[[2-(3-methyl-2(3H)-benzothiazolylidene) hydrazinylidene]methyl]phenyl ester, 2-Propenoic acid 4-[[2-(3-methyl-2(3H)-benzothiazolylidene)hydrazinylidene]methyl]phenyl ester, Benzoic acid 4-[(2-methyl-1-oxo-2-propen-1-yl)amino]-2-methoxy-4-[[2-(3-methyl-2(3H)-benzothiazolylidene)hydrazinylidene]methyl]phenyl ester. It has been observed that using these benzothiazolylidene derivatives as UV curable monomers, instead of the benzotriazole, benzophenone or triazine based acrylates, results in a better adhesion of the primer towards the encapsulant layer.

Acrylate Monomer Unit Containing a Crosslinkable Group

The acrylic resin is a copolymer comprising at least 2 wt %, preferably at least 5 wt %, more preferably at least 10 wt %, most preferably at least 20 wt % of an acrylate monomer unit containing a crosslinkable group.

Examples of curable groups include hydroxyl, carboxyl, amino, glycidyl, silyl, silanate, epoxy and isocyanate groups. Preferred curable groups are hydroxyl groups.

Examples of acrylate monomers comprising a hydroxyl group include 2-hydroxy-ethyl(meth)acrylate, 2-hydroxy-propyl(meth)acrylate, 2-hydroxy-butyl(meth)acrylate, polyethyleneglycol (meth)acrylate, polypropyleneglycol (meth)arylate and caprolactone-modified hydroxyl(meth)acrylate.

Acrylate Monomer Unit Containing a HALS Group

The acrylic resin optionally may comprise an acrylate monomer unit containing a HALS group. Such a Hindered Amine Light Stabilizer is a well known UV stabilizing agent. Such a HALS compound may be introduced into the acrylic resin by using an acrylate monomer comprising a sterically hindered amino group.

Examples of such monomers include 4-(meth)acryloyloxy-2,2,6,6-tetramethyl-piperidine, 4-(meth)acryloylamino-2,2,6,6-tetramethyl-piperidine, 4-(meth)acryloyloxy-1,2,2,6,6-pentamethylpiperidine, 4-(meth) acryloylamino-1,2,2,6,6-pentamethylpiperidine, 4-cyano-4-(meth) acryloylamino-2,2,6,6-tetramethylpiperidine, 1-(meth) acryloylamino-4-(meth)acryloylamino-2,2,6,6-tetramethylpiperidine, 4-crotonoyl-2,2,6,6,-tetramethylpiperidine, 4-crotonoylamino-2,2,6,6,-tetramethylpiperidine and 1-crotonoyloxy-2,2,6,6,-tetramethyl-piperidine.

The acrylic resin preferably comprises at least 0.5 wt %, more preferably at least 1 wt %, most preferably at least 2 wt % of an acrylate monomer unit containing a HALS group, relative to the total weight of monomer units.

Other Acrylate Monomers Units.

The acrylic resin may contain other acrylic monomers. These other monomers may be chosen to optimize the properties of the acrylic resin, for example to optimize the Tg of the acrylic resin.

Examples of such acrylate monomers include isobutyl (meth)acrylate, sec-butyl(meth)acrylate, tert-butyl(meth)acrylate, isoamyl (meth)acrylate, 2-ethylhexyl(meth)acrylate, isononyl(meth)acrylate, isodecyl(meth)acrylate, and tert-butylhexyl(meth)acrylate.

Preferably, the acrylic resin comprises alicyclic acrylate monomers units. Examples of such alicyclic acrylate monomers units include cyclopentyl(meth)acrylate, cyclohexyl (meth)acrylate, methylcyclo hexyl(meth)acrylate, cyclododecyl(meth)acrylate, bornyl(meth) acrylate, and isobornyl (meth)acrylate.

The acrylic resin preferably comprises at least 20 wt %, more preferably at least 40 wt %, most preferably at least 60 wt % of an alicyclic acrylate monomer unit, relative to the total weight of monomer units.

Commercially available acrylic resins containing a UV absorbing compound and a HALS compound are the HALSHYBRID UV-G series from Nippon Shokubai.

The amount of the acrylic resin in the primer is preferably between 0.05 and 5.0 g/m$^2$, more preferably between 0.1 and 2.5 g/m$^2$, most preferably between 0.25 and 1.0 g/m$^2$.

Crosslinking Agents

The crosslinking agents may be selected from epoxy compounds, isocyanate compounds, melamine compounds, carbodiimide compounds and oxazoline compounds.

The crosslinking agents are preferably polyisocyanate compounds. Standard commercial polyisocyanates are all derived from just a few diisocyanates with aliphatic, alicyclic (or cyclic aliphatic) or aromatic isocyanate groups.

The most important diisocyanates that are available on an industrial scale are summarized in Table 1.

TABLE 1

| Chemical Formula | Chemical name |
|---|---|
| | Hexamethylene diisocyanate (HDI) |
| | Isophorone diisocyanate (IPDI) |
| | Bis(4-isocyanato-cyclohexyl)methane (H12MDI) |
| | 2,4 and 2,6-toluene diisocyanate (TDI) |
| | Diphenylmethane-4,4' and/or-2,4'-diisocyanate (MDI) |
| | 2,2,4- and 2,4,4-trimethyl-hexamethylene diisocyanate (TMDI) |

TABLE 1-continued

| Chemical Formula | Chemical name |
|---|---|
| | |
| | meta-xylylenediisocyanate (XDI) |
| | Hexahydro-meta-xylylenediisocyanate (1,3-H6XDI) |
| | Tetramethyl-meta-xylylene diisocyanate (TMXDI) |

With the exception of MDI, the diisocyanate compounds of the table above are classified as toxic substances. For this reason, and also to increase the functionality, the diisocyanates are converted to polyisocyanates. Polyisocyanates with a functionality of greater than 2 makes spatial cross-linking possible.

The manufacturing process for making these polyisocyanate compounds results in oligomer mixtures exhibiting a molecular weight distribution. This makes it possible to optimize the products towards viscosity, isocyanate functionality, etc.

Aliphatic polyisocyanate compounds may be derived from HDI and TMDI, alicyclic polyisocyanate compounds from IPDI, H12MDI and 1,3-H6XDI, and aromatic polyisocyanate compounds from TDI, MDI, XDI and TMXDI.

Prepolymers based on aliphatic or aromatic diisocyanates may also be used. Such products may be obtained by the reaction of diisocyanates with long-chain polyols, especially polyether polyols.

The primer may comprise aliphatic, aromatic or alicyclic isocyanate crosslinking agents, or a combination thereof.

The molar ratio of the isocyanate groups of all the isocyanate crosslinking agents and the crosslinkable groups, preferably the hydroxyl groups, of the binder ([NCO]/[OH]) is preferably between 0.25 to 2.5, more preferably between 0.50 and 1.75, most preferably between 0.75 and 1.50. It has been observed that the molar ratio [NCO]/[OH] is preferably higher for aqueous layers than for solvent based layers probably because water may react with NCO groups, making them unavailable for the crosslinking reaction.

In addition to the acrylic resin and the crosslinking agent described above, the primer may comprise other types of resin, for example those disclosed for the weather resistant outerlayer.

Silane Compounds

It has been observed that the adhesion of the primer towards the encapsulant layer is further improved when a silane compound is added to the primer layer. Preferred silanes are epoxy silanes or amino silanes.

Examples of commercially available epoxy silanes are CoatOSil*MP200, CoatOSil*2287, CoatOSil*1770, Silquest A-187, Silquest A-1871, Silquest A-186 from MOMENTIVE; SCA-403 from ITOCHU; Dynasylan® GLYMO from EVONIK; and Dow Corning® Z-6040 silane from DOW CORNING.

Examples of commercially available amino silanes such are Silquest A1170, Silquest A Link 15, Silquest A-1100, Silquest A-1110, Silquest A-1130, Silquest A-1120 from MOMENTIVE; SCA-603 from ITOCHU, Dow Corning® Z-6020 Silane, Dow Corning® Z-6011 Silane from DOW CORNING.

Another prefered silane compound is Geniosil® GF 31 from Wacker.

Isocyanato functional silanes such as A-Link 25 and A-Link 35 from MOMENTIVE may also be used.

Other silane additives that may be used are Vestanat EP-M95, Tegopak bond 150 from EVONIK; A-Link 597 and Silquest A-1524 from MOMENTIVE; kaneka XMAP SA110S, kaneka Silyl SAX015, Silyl SAT145 from KANEKA; Geniosil® XB 502, Geniosil SMP100, from Wacker from WACKER; Dow Corning® silane AY43-031, Dow Corning silane AY43-026, Dow Corning silane Z-6920 and Dow Corning® silane Z-6940 from DOW CORNING.

The silane compound may be incorporated into the acrylic resin containing the UV absorber and the crosslinkable group. Polymerizable silane additives that may be used to incorporate silane compounds into the acrylic resin are for example SCA-503 from ITOCHU; Silquest A-171, Silquest A-151NT, Silquest A-2171 from MOMENTIVE; Vinyl methyldimethoxysilane, Kaneka silyl max 923 from KANEKA; Dow Corning® Silane Z-6030, Dow Corning silane Z-6300, Dow Corning® silane Z-6032 and Dow Corning® silane AY43-060 from DOW CORNING; Dynasylan 1124 from EVONIK.

Other Ingredients of the Primer

The primer may contain inorganic fine particles. These may be selected from silica, calcium carbonate, magnesium oxide, magnesium carbonate, and tin oxide. Tin oxide and silica are preferred.

The particle size of the inorganic particles is preferably from 10 to 700 nm, more preferably from 20 to 300 nm.

The amount of these inorganic particles is preferably between 5 and 400 wt %, more preferably between 10 and 300 wt %, relative to the total weight of the binder.

The primer may also contain matting agents, such as polystyrene, poly(methyl methacrylate) or polyamide matting agents.

The primer may also contain a surfactant, such as an anionic or nonionic surfactant.

Applying the Primer on the Support

The primer is preferably applied on the polymeric support by coating a coating liquid on the support. Any known coating method, such as gravure coating, roll coating, bar coating, knife coating or curtain coating may be used.

The coating solvent may be water or an organic solvent, such as for example MEK, ethyl acetate, or butyl acetate.

The thickness of the primer is preferably between 0.05 and 8 µm, more preferably between 0.1 and 5 µm. The primer may consist of one layer or of two or more layers.

The surface of the support on which the primer is applied may be surface treated, as described below, to improve the adhesion of the primer and the encapsulant to the polymeric support.

The coating solution of the primer may be applied on the polymeric support before or after the support has been biaxially stretched or, more preferably, in between the longitudinal and lateral stretching.

Weather Resistant Layer

The weather resistant layer preferably comprises a binder containing a crosslinkable group. Such a crosslinkable group is also referred to as a functional group or a curable group.

The crosslinkable group of the binder may be selected from a hydroxyl group, a carboxyl group, an amino group, a glycidyl group, a silyl group, a silanate group, an epoxy group, a 1,3-dicarbonyl group (e.g. aceto acetoxy methacrylate of diacetone acrylamide), or an isocyanate group. Among these, a hydroxyl group is particularly preferred.

In a preferred embodiment, the binder is a fluorine-based polymer having a crosslinkable group such as disclosed in for example EP-A 1938967, WO2007072826 and EP-A 2309551.

Examples of curable groups that may be introduced into the fluorine-based polymers are for example hydroxyl, carboxyl, amino, glycidyl, silyl, silanate, a 1,3-dicarbonyl group (e.g. aceto acetoxy methacrylate of diacetone acrylamide), and isocyanate groups. Preferred curable groups are hydroxyl groups.

The curable groups may be introduced into the fluorine-based polymers by copolymerizing a fluoro-olefin with a monomer containing a curable group.

The fluoro-olefin may be tetrafluoro ethylene (TFE), chlorotrifluoro ethylene (CTFE), hexafluoro-propylene, vinyl fluoride, or vinylidene fluoride. Among these, TFE and CFTE are particularly preferred from the viewpoint of weatherability and solvent resistance of the coated layer. One type of fluoro-olefin may be used or two or more types may be used in combination. As the proportion of fluoro-olefin monomers in the fluoropolymer becomes larger, the weatherability of the coated film will improve. On the other hand, when it becomes smaller, the solubility of the fluoropolymer will improve. The proportion of fluoro-olefin monomer relative to the total monomer amount is preferably between 30 to 70 mol %, more preferably between 40 and 60 mol %.

Examples of hydroxyl-containing monomers are hydroxyl-containing vinyl ethers such as 2-hydroxyethyl vinyl ether, 3-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether and 6-hydroxyhexyl vinyl ether, hydroxyl-containing allyl ethers such as 2-hydroxyethyl allyl ether, 4-hydroxybutyl allyl ether and glycerol monoallyl ether, or hydroxyalkyl esters of (meth)acrylic acids such as 2-hydroxyethyl acrylate and 2-hydroxy-ethyl methacrylate. Other examples are disclosed in EP2309551, paragraph [0024]-[0026]. Among these, hydroxyl-containing vinyl ethers, especially 4-hydroxybutyl vinyl ether and 2-hydroxyethyl vinyl ether are particularly preferred.

The hydroxyl group content of the fluoropolymer is preferably between 30 and 200 mg KOH/g, more preferably between 40 and 150 mg KOH/g.

Examples of carboxyl-containing monomers, of amino-containing monomers, and of silyl-containing monomers are disclosed in EP-A 1938967, paragraphs [0028] to [0032] and EP2309551, paragraphs [0028] to [0036].

Besides the fluoro-olefin and the monomer containing the curable group, other monomers may be incorporated in the fluoropolymer. Preferred monomers have a $C_{2-20}$ linear or branched alkyl group and a polymerizable unsaturated group linked to each other by an ether or an ester bond. Examples of such monomers are disclosed in EP2309551, paragraph [0059]-[0077].

Other preferred monomers that may be used in combination with the monomers described above are for example ethylene, propylene, n-butene, isobutene, or vinyl benzoate.

Commercially available TFE fluoro-polymers are for example the Zeffle™ GK polymers from DAIKIN INDUSTRIES. Typical grades for solvent based applications are Zeffle GK570 and Zeffle GK571.

Typical grades for water based applications are Zeffle SE-310, Zeffle SE-405, and Zeffle SE-700. Commercially available CTFE fluoropolymers are for example the LUMIFLON® polymers from ASAHI GLASS. Typical grades for solvent based applications are Lumiflon LF200F and Lumiflon FL916F. Typical grades for water based applications are Lumiflon FD1000 and Lumiflon FE4300. Other commercially available fluoro-polymers which may be used are for example the FLUONATE™ fluoropolymers from DAINIPPON INK&CHEMICALS, for example Fluonate K-700 and K-702 for solvent based coatings. The commercially available OBBLIGATO® coating formulations from AGC COAT-TECH, for example Obbligato SW0011F Clear, also contain a fluoro-polymer containing a crosslinkable group. Fluorinated Oxetane polymers and oligomers with the tradename POLYFOX from the company OMNOVA, such as Polyfox 652, Polyfox PF159N, Polyfox 6520 for solvent based applications and Polyfox 652, and Polyfox PF159N and Polyfox 6520 for water based applications may also be used. Other fluoropolymers which can be used are Acrymax grades from Acrymax technologies Inc, e.g Acrymax AF-5500 and copolymers of trifluoroethyl methacrylate, such as Neocryl AF10, available from DSM Neoresins.

In another preferred embodiment, the binder is an acrylic resin comprising crosslinkable groups. Such polymers are typically copolymers of alkyl (meth) acrylate monomers and hydroxyl containing (meth)acrylate monomers. Preferred monomers are methyl (meth)acrylate, butyl(meth)acrylate and hydroxyethyl (meth)acrylate. Such acrylic resins are for example the commercially available DEGALAN® acrylic resins from EVONIK, and the URACRON™ and NEOCRYL™ acrylic resins from DSM, and the SYNOCURE™ acrylic resins from CRAY VALLEY ACRYLICS. Other acrylic resins which can be used are ENCOR 2171 (previously Craymul 2171) from ARKEMA, BAYHYDROL grades, e.g. Bayhydrol A2601 from BAYER, JONCRYL grades, such as Joncryl OH8312 from BASF.

The acrylic resin containing an UV absorbing group and a crosslinkable group of the primer disclosed above may also be used as binder in the weather resistant layer.

Preferably, the weather resistant layer comprises a mixture of both fluoropolymers and acrylic resins disclosed above. The ratio of the amount of the fluoropolymer to the acrylic resin is preferably less than 4.0, more preferably less than 3.0, most preferably less than 2.

Other binders, with and without crosslinkable groups may be added to the weather resistant layer.

The weather resistant layer preferably comprises a crosslinking agent. The crosslinking agents described for the primer above may also be used for the weather resistant layer.

Catalyst may be added to improve the crosslinking efficiency of the binders. Well known catalysts are Sn based catalysts such as dibutyl tin dilaurate (DBTL) or dioctyl tin laurate. It may however be advantageous to use Zn or Bi based catalysts instead of the commonly used Sn based catalysts. For example, with Bi and Zn based catalyst, an optimal curing speed was obtained combining good physical properties of the weather resistant layer and an efficient production of that layer.

Zinc based catalysts are for example K-KAT-XK-622 and XK-614 from King Industries and Octa-Soligen® Zn catalysts from Borchers.

Bismuth based catalysts are preferably used. Bismuth based catalysts are for example Borchi® Kat 0243, Borchi® Kat 0244 and Borchi® Kat 315 from Borchers and Dabco® MB20 from Air Products.

Borchi® Kat 0244 comprises both bismuth and zinc.

The amount of catalyst depends on the type of catalyst but is preferably between 0.005 and 3.00 wt % relative to the total amount of binder having a crosslinkable group, more preferably between 0.05 and 2.00 wt %, most preferably between 0.1 and 1.00 wt %.

The amount of catalyst depends on the type of catalyst but is preferably between 0.005 and 3.00 wt % relative to the total amount of binder having a crosslinkable group, more preferably between 0.05 and 1.00 wt %, most preferably between 0.01 and 0.50 wt %.

To protect the support from UV light, the weather resistant layer preferably comprises a UV light absorber and/or an UV light stabilizer.

A UV light absorbing compound absorbs at least part of the UV light that reaches the weather resistant layer.

The UV light absorbing compound may be an organic or an inorganic UV absorbing compound.

The UV light absorbing compounds and UV light stabilizers that may be added to the polyester support (see below) may also be used in the weather resistant layer.

Preferred UV light absorbing compounds are inorganic UV absorbing particles such as $TiO_2$ particles, ZnO particles and mixtures thereof.

The particle size of these inorganic UV absorbing compounds is preferably between 0.01 and 5.00 µm, more preferably between 0.10 and 2.50 µm, most preferably between 0.20 and 1.00 µm The amount of the inorganic UV absorbing particles is preferably between 2.5 and 20 $g/m^2$, more preferably between 5 and 15 $g/m^2$.

The outer layer may also comprise other ingredients such as surfactants, fillers such as for example colloidal silica, and others to further optimize its properties.

The total dry coating weight of the weather resistant layer is preferably between 5 and 75 $g/m^2$, more preferably between 10 and 50 $g/m^2$, most preferably between 15 and 35 $g/m^2$.

The weather resistant layer may be coated from an aqueous or non-aqueous coating solution.

When a solvent based coating solution is used, preferred solvents are Methyl Ethyl Ketone (MEK), n-butylacetate, and ethylacetate.

When an aqueous coating solution is used, organic solvents may be mixed with water to improve the solubility of the ingredients. Examples of such solvents are acetone, methoxypropanol and glycolethers.

The weather resistant layer is preferably applied after the support has been biaxially stretched. The layer is preferably applied "online", i.e. immediately after biaxially stretching the support.

Support

The support, also referred to as substrate, used in the backsheet of a preferred embodiment of the present invention is preferably a polymeric support. The support may be provided with additional layers to improve the adhesion towards the primer and/or the weather resistant layer.

Examples of a polymeric support include supports made of polyesters, polyolefins, such as polypropylene and polyethylene, or polyamides, such as polyamide 12 (Nylon 12). Examples of polyesters that can be used for the support are polyethylene terephthalate (PET), polybutylene terephthalate (PBT), 2,6-naphthalene terephthalate (PEN), a copolymer of 1,4-cyclohexanedimethanol, 1,2-ethanediol and 1,4-benzenedicarboxylic acid (PETG) and a copolyester containing isosorbide. A particularly preferred support is a PET support.

Production of a Polyester Support

A typical polyester resin production process comprises two phases: an esterification and/or transesterification step of a dicarboxylic acid, or its ester derivative, and a diol compound, followed by a polycondensation step.

Optionally, the resulting polyester after the polycondensation step may be subjected to a so called solid state polymerization to further increase the Molecular Weight (MW) of the polyester, for example to decrease the amount of terminal carboxyl groups.

The resulting polyester resin is then fed to a melt extruder to form a polyester film which is then biaxially stretched to form a biaxially oriented polyester film (i.e. the polyester support) having a specific thickness.

A catalyst is typically used in the polyester production process. Such a catalyst may be present in the esterification step, in the polycondensation step, or in both.

Several other compounds may be added during the polyester production process, to optimize the polymerization reaction and/or the physical properties of the resulting polyester resin or film. Such compounds may be present in the esterification step, in the polycondensation step, in both the esterification and the polycondensation step, or may be added together with the polyester resin to the melt extruder before film formation.

Dicarboxylic Acid

The dicarboxylic acids may be selected from aliphatic, alicyclic and aromatic dicarboxylic acids.

Examples of an aliphatic dicarboxylic acid are malonic acid, succinic acid, glutaric acid, adipic acid, suberic acid, sebacic acid, dodecanedioic acid, dimer acid, eicosane dioic acid, pimelic acid, azelaic acid, methylmalonic acid and ethylmalonic acid.

Examples of an alicyclic dicarboxylic acid are adamantane dicarboxylic acid, norbornene dicarboxylic acid, cyclohexanedicarboxylic acid and decalin dicarboxylic acid.

Examples of an aromatic dicarboxylic acid are terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic, 4,4'-diphenyl dicarboxylic acid, 4,4'-diphenylether dicarboxylic acid, and 5-sodium-sulfoisophthalic acid.

Preferably, at least one aromatic dicarboxylic acid is used. More preferably, at least 80 wt % of the dicarboxylic acids used is an aromatic dicarboxylic acid. Most preferably, the dicarboxylic acids used are selected from terephthalic acid and isopthalic acid.

Diol Compound

The diol compounds may be selected from aliphatic diol compounds, alicyclic diol compounds and aromatic diol compounds.

Examples of aliphatic diol compounds are ethylene glycol, 1,2-propanediol, 1,3-propanediol, 1,4-butanediol, 1,2-butanediol, and 1,3-butanediol.

Examples of alicylic diol compounds are cyclohexane dimethanol, spiroglycol, isosorbide, and 2,2,4,4-tetramethyl-1,3-cyclobutanediol (CBDO).

Examples of aromatic diol compounds are bisphenol A, 1,3-benzene-dimethanol, and 1,4-benzenedimethanol.

Preferably, at least one aliphatic diol compound is used. Most preferably, ethylene glycol is used as diol compound.

Compounds Having Three or More Carboxyl Groups or Hydroxyl Groups

When using a small amount of compounds having three or more carboxyl groups or hydroxyl groups, branching of the polyester molecular chains may be induced, therefore promoting the entanglement of the polyester chains. As a result, when the polyester molecules are hydrolyzed and the molecular weight of the polyester is thereby lowered, embrittlement of the polyester film can be avoided. Such an entanglement may also inhibit thermal shrinkage of the polyester film. Such compounds and the preferred amounts used thereof are disclosed for example in US2011/0306747, paragraphs [0121] to [0127].

Esterification

The aromatic dicarboxylic acid and the aliphatic diol may be introduced into the production process by preparing a slurry containing these compounds, and supplying the slurry to the esterification phase. The esterification may be carried out using a multistage unit of at least two reactors connected in series, in which ethylene glycol is kept under reflux and water and alcohol formed by the reaction are removed out of the system.

The amount of the aliphatic diol, for example ethylene glycol, is preferably between 1.015 and 1.50 mol per mol of the aromatic dicarboxylic acid, for example terephthalic acid, or its ester derivative, more preferably between 1.10 and 1.30 mol, most preferably between 1.15 and 1.25 mol.

Polycondensation

The esterified product produced in the esterification step is then polycondensed. The polycondensation may be carried out in one stage or in multiple stages. The polycondensation is typically carried out under reduced pressure.

Catalyst

In the polyester production process, any known conventional catalyst may be used, such as alkali metal compounds, alkaline earth metal compounds, zinc compounds, lead compounds, manganese compounds, cobalt compounds, aluminium compounds, antimony compounds, titanium compounds, germanium compounds, or phosphorus compounds. Preferably an antimony compound, a germanium compound or a titanium compound is used in the polyester production.

Most preferably, a titanium catalyst (Ti catalyst) is used. The Ti catalyst includes oxides, hydroxides, alkoxides, carboxylates, carbonates, oxalates, organic chelate Ti complexes, and halides. Two or more different types of Ti compounds may be used. Preferred Ti catalysts are organic chelate Ti complexes with an organic acid as a ligand. The organic acid may be selected from citric acid, lactic acid, trimellitic acid, and malic acid. Preferably a chelate Ti complex with citric acid as ligand is used. Such a citrate chelate Ti catalyst is commercially available as Tyzor AC422 from Dorf Ketal or Ti184 from Catalytic Technologies.

The catalyst may be added in the esterification phase, in the polycondensation phase or in both phases. The amount of the catalyst is preferably from 1 to 50 ppm, more preferably from 2 to 30 ppm, most preferably from 3 to 15 ppm, in terms of the Ti element.

Phosphorus Compound

Preferably, a pentavalent phosphorus compound not having an aromatic ring as a substituent is used in combination with a Ti catalyst.

The pentavalent phosphorus compound may be selected from trimethyl phosphate, triethyl phosphate, tri-n-butyl phosphate, trioctyl phosphate, tris(triethylene glycol) phosphate, methyl acid phosphate, ethyl acid phosphate, monobutyl phosphate, dibutyl phosphate, dioctyl phosphate, and triethylene glycol acid phosphate.

Most preferably trimethyl phosphate and triethyl phosphate are used. In combination with the citrate chelate Ti catalyst mentioned above, using trimethyl phosphate or triethyl phosphate results in a polyester resin having a balanced polymerization activity, color tone and thermal stability.

The pentavalent phosphorus compound is preferably added in the esterification phase, but may also be added to the polycondensation phase or to both phases. The amount of pentavalent phosphorus compound is preferably from 1 to 100 ppm, more preferably from 5 to 50 ppm, most preferably from 7.5 to 25 ppm, in terms of the P element.

Magnesium Compound

Adding a magnesium compound (Mg compound) imparts static electricity properties to the resin film. The magnesium compound may be selected from magnesium oxide, magnesium hydroxide, magnesium alkoxide, magnesium acetate, and magnesium carbonate. Among these magnesium compounds, magnesium acetate is preferred.

The Mg compound may be added in the esterification phase, in the polycondensation phase or in both phases. The Mg compound may also be added in the extruder, i.e. in the melt. The amount of the magnesium compound is preferably from 1 to 100 ppm, more preferably from 2 to 50 ppm, most preferably from 3 to 30 ppm, in terms of the Mg element.

Polyester Film Formation

Extrusion

After the polycondensation step, the polycondensation product is either directly fed to the melt extruder, or the polycondensate product is first pelletized and then melted in the extruder.

The melt temperature in the extruder is preferably from 250 to 320° C., more preferably from 260 to 310° C., most preferably from 270 to 300° C. The extruder may be a single-screw extruder or a multi-screw extruder. The extruder may be purged with nitrogen to prevent the formation of terminal carboxyl groups through thermal oxidative (or thermo-oxidative) decomposition.

The melt is preferably extruded out through an extrusion die via a gear pump and a filter unit.

The extruded melt is then cooled on one or more chill rolls to form a film thereon. The temperature of the chill rolls is preferably from 5 to 80° C., more preferably from 15 to 70° C., most preferably from 20 to 60° C. When two chill rolls are used, the temperature of both may be different, for example between 5 and 25° C. for the first chill roll and between 30 and 60° C. for the second chill roll.

To enhance the adhesion between the resin melt and the chill roll and to increase the cooling efficiency, static electricity is preferably applied to the chill roll before the melt is brought into contact therewith.

Stretching

The extruded film is then stretched, preferably biaxially stretched, to obtain the polyester film.

The draw ratio in both the longitudinal and the lateral direction is preferably between 2 and 5. In biaxial stretching, the order of longitudinal stretching (the Machine Direction (MD) or the running direction of the film) and lateral stretching (Cross Direction (CD) or the width direction) is not specifically defined. Preferably, the longitudinal stretching is carried out first.

It is preferred that the lateral draw ratio is larger than the longitudinal draw ratio. Preferably the lateral draw ratio/longitudinal draw ratio is from 1.05 to 1.25, more preferably from 1.10 to 1.20.

The stretching temperature is preferably from 80 to 160° C., more preferably from 85 to 155° C. It is preferred that the stretching temperature in the latter stretching, preferably the lateral stretching, is higher than the temperature in the former stretching, preferably the longitudinal stretching.

Besides this stepwise biaxially stretching method, wherein stretching in a longitudinal direction and stretching in a width direction are performed separately, a simultaneous biaxially stretching method, wherein stretching in a longitudinal direction and stretching in a lateral direction are performed at the same time, may also be used.

Thermofixation

In order to complete crystal orientation and to impart flatness and dimensional stability to the biaxially stretched film, the film is preferably subjected to a heat treatment for 1 to 30 sec while the sides of the biaxially stretched film are fixed, preferably at a temperature equal or higher than the glass transition temperature (Tg) of the resin but lower than the melting temperature (Tm) thereof. Such a heat treatment is then followed by a uniform and gradual cooling to room temperature.

Such a treatment is often referred to as thermofixation.

When the thermofixation temperature is too low, the heat shrinkage of the resulting film increases. On the other hand, when the heat treatment temperature is too high, the hydrolytic stability of the resulting film decreases. Preferred thermofixation temperatures are between 160 and 250° C., more preferably between 175 and 235° C., most preferably between 200 and 225° C.

Relaxation

In addition to and after the thermofixation, a so called relaxation treatment may be carried out. Such a relaxation treatment is preferably carried out at a temperature from 80 to 160° C., more preferably from 100 to 140° C. The degree of relaxation is from 1 to 30%, more preferably from 2 to 25%, most preferably from 3 to 20%.

The relaxation may be attained in the lateral or longitudinal direction of the film, or in both directions.

Thickness of the Film

The thickness of the biaxially stretched polyester film is preferably between 75 μm and 500 μm, more preferably between 100 μm and 350 μm, most preferably between 125 μm and 250 μm.

Carboxyl Groups in the Polyester

Carboxyl groups present in the polyester may work as an acid catalyst in the hydrolysis of polyester molecules. Such hydrolysis, for example when the polyester is kept for a certain period of time in high moisture conditions, results in a decrease of the molecular weight and therefore in a decrease of the mechanical strength of the polyester film. To obtain a sufficient hydrolytic stability of the polyester film, the carboxyl group content is preferably as low as possible.

On the other hand, carboxyl groups at the surface of the polyester film may enhance the adhesion between the polyester film and layers provided thereon. For that reason, the carboxyl group content is preferably not zero.

The carboxyl group content of the polyester film is preferably between 0 and 40 meq/kg, more preferably between 5 and 20 meq/kg.

To ensure low concentrations of carboxyl groups in the polyester film, high temperatures during the complete preparation process of the film, for example during the polycondensation process, are kept as low as possible.

To further reduce the number of carboxyl groups of the polyester, compounds that react with a carboxyl group of the polyester may be added to the polyester. Examples of such compounds include carbodiimide compounds, epoxy compounds, and oxazoline compounds.

Carbodiimide Compounds

The carbodiimide compounds may be classified into monofunctional and polyfunctional carbodiimides. Examples of monofunctional carbo-diimides include N,N'-dicyclohexylcarbodiimide, 1,3-diisopropyl-carbodiimide, N,N'-diisopropylphenylcarbodiimide, N,N'-dimethyl-carbodiimide, N,N'-diisobutylcarbodiimide, N,N'-dioctylcarbodiimide, t-butylisopropylcarbodiimide, N,N'-diphenylcarbodiimide, N,N'-di-t-butyl-carbodiimide, 1-(3-dimethylaminopropyl)-3-ethyl carbodiimide, and dinaphthyl carbodiimide.

Examples of commercially available carbodiimide compounds include Stabaxol I from Rheinchemie and Stablizer 7000 from Rashig, both based on N,N'-diisopropylphenyl-carbodiimide.

Polyfunctional carbodiimides are typically polycarbodiimide compounds, i.e. a polymer obtained by polymerizing a carbodiimide compound. An specific example of such a polycarbodiimide is poly(1,3,5-triisopropylphenylene-2,4-dicarbodiimide).

Examples of commercially available polymeric carbodiimides include Stabilizer 9000 from Raschig and Stabaxol P from Rheinchemie. Other polymeric carbodiimides available from Rheinchemie are Stabaxol P100 and Stabaxol P200.

As carbodiimide compounds may generate an isocyanate-type gas through thermal decomposition, carbodiimide compounds having a high heat resistance are preferably used. It has been observed that an increase in molecular weight of polymeric carbodiimides, results in an improvement of the thermal decomposition.

Epoxy Compounds

Preferred examples of the epoxy compounds include glycidyl ester compounds and glycidyl ether compounds. Other preferred examples are those disclosed in WO2012120260 (for example Cardura E10P).

Other preferred epoxy compounds are epoxidized fatty acid esters or epoxidized fatty acid glycerides such as disclosed in US2010/0120946 paragraphs [0020] to [0067].

Still other preferred epoxy compounds are the so called chain extenders disclosed in for example US2010/0120947. Chain extenders are molecules with at least two reactive groups, preferably an epoxy group, which can react with the polyester during extrusion and join polyester chains to one another. Typically, their reactive groups are already depleted substantially (to an extent of 75% or more) during the extrusion and are no longer available for a chain repair during the use of the polyester film after the production thereof.

Preferred chain extenders are difunctional epoxides, even more preferred chain extenders are polyfunctional epoxides. The epoxy function is arranged terminally at the end of the molecule chain or of a side chain. Polyfunctional epoxides are preferred since lower amounts are required, higher molecular weight end products are formed, and lower level of gaseous cleavage products are formed. Commercially available chain extenders include polymers sold by BASF under the Joncryl ADR brand name.

Oxazoline Compounds

The oxazoline compounds are preferably bisoxazoline compounds such as 2,2'-bis(2-oxazoline), 2,2'-bis(4-methyl-2-oxazoline), 2,2'-bis(4,4'-dimethyl-2-oxazoline), 2,2'-bis(4-methyl-2-oxazoline), 2,2'-bis(4-ethyl-2-oxazoline), 2,2'-bis(4,4'-diethyl-2-oxazoline),2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cylcohexyl-2-oxazoline), 2,2'-bis(4-benzyl-2-oxazoline), 2,2'-p-phenylenebis(2-oxazoline), 2,2'-m-phenylenebis(2-oazoline), 2,2'-o-phenylenebis(2-oxazoline), 2,2'-p-phenylene-bis(4-methyl-2-oxazoline), 2,2'-p-phenylenebis(4,4-dimethyl-2-oxazoline), 2,2'-m-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'octamethylenebis(2-oxazoline), 2,2'-decamethylenebis(2-oxazoline), 2,2'-ethylenebis(4-methyl-2-oxazoline), 2,2'-ethylenebis(4,4-dimethyl-2-oxazoline), 2,2'-9,9'-diphenoxyethanebis(2-oxazoline), 2,2'-cyclohexylenebis(2-oxazoline) and 2,2'-diphenylenebis(2-oxazoline). Among these, 2,2'-bis(2-oxazoline) is most preferably used from the viewpoint of reactivity with the polyester.

A particularly preferred oxazoline compound is 2-Phenyl-4,5-dihydrooxazole and 4,5-Dihydro-2-phenyl-6H-1,3-oxazine.

The bisoxazoline compounds may be used individually, or two or more different compounds may be used together.

The amount of the carbodiimide compounds, the epoxy compounds, or the oxazoline compounds in the polyester film is typically from 0.1 to 5 wt %, preferably from 0.3 to 4 wt %, more preferably from 0.5 to 3 wt %, relative to the total weight of the polyester resin.

UV Light Absorber/UV Light Stabilizer

To prevent degradation caused by UV light, UV light absorbers and/or UV light stabilizers may be added to the polyester film. UV light absorbers absorb UV light and convert it into heat energy, while UV light stabilizers scavenge radicals generated by photodecomposition of the polyester resin and prevent further decomposition of the resin. A degradation of the polyester resin may result in a decrease of the partial discharge voltage, in a decrease of the strength of the polyester film, and in a color tone change (for example yellowing) of the polyester film.

The UV light absorbing compound may be an organic or an inorganic UV absorbing compound.

Examples of organic UV light absorbers include salicyl acid compounds such as p-t-butylphenylsalicylate or p-octylphenyl salicylate, benzophenone compounds such as 2,4-dihydroxy benzophenone, 2-hydroxy-4-methoxy benzophenone, 2-hydroxy-4-methoxy-5-sulfo benzophenone, 2,2'4,4'-tetrahydroxy benzophenone, and bis(2-methoxy-4-hydroxy-5-benzoylphenyl)methane, benzotriazole compounds such as 2-(2'-hydroxy-5'-methylphenyl)benzotriazole and 2,2'-methylene bis[4-(1,1,3,3-tetramethylbutyl)-6-(2H-benzotriazole-2-yl)phenol], cyanoacrylate compounds such as ethyl-2-cyano-3,3'-diphenyl acrylate, triazine compounds such as 2-(4,6-diphenyl-1,3,5-triadizine-2-yl)-5-[(hexyl)oxy]-phenol (Tinuvin 1577) and 2-(2-Hydroxy-4-(2-ethylhexyl)oxyphenyl)-4,6-di(4-phenyl-phenyl)-1,3,5-triazine (Tinuvin 1600) and, 2-[4-[4,6-bis([1,1'-biphenyl]-4-yl)-1,3,5-triazin-2-yl]-3-hydroxyphenoxy]-propanoic acid isooctyl ester (Tinuvin 479).

Examples of inorganic UV absorbers are $TiO_2$ particles, ZnO particles and mixtures thereof.

Examples of UV light stabilizers are hindered amine compounds such as bis(2,2,6,6-tetramethyl-4-piperidyl) sebacate and the polycondensate of dimethylsuccinate and 1-(2-hydroxyethyl)-4-hydroxy-2,2,6,6-tetramethyl piperidine.

The content of the UV light absorber or UV light stabilizer in the polyester resin composition is preferably from 0.1 to 10 wt %, more preferably from 0.3 to 7 wt %, even more preferably from 0.7 to 4 wt %.

Other Additives

It is preferred to add inorganic particles to the polyester to optimize properties as slipperiness, abrasion resistance, scratch resistance of the surface of the polyester film. Examples of inorganic particles are for example particles of clay, mica, titanium oxide, calcium carbonate, kaolin, talc, silica, calcium phosphate, barium sulfate, alumina, and zirconia.

Preferred inorganic particles are silica and alumina. The amount of silica and/or alumina is preferably between 0.025 and 1.500 wt %, more preferably between 0.050 and 1.000 wt %.

Optical brighteners such as 2,5-thiophenediylbis(5-tert-butyl-1,3-benzoxazole) (Uvitex OB, Benetex OB Plus) may also be added to the polyester.

Master Batch Technology

It is preferred that additives such as inorganic particles, UV light absorbing compounds, additives to improve the hydrolytic resistance are added to the polyester resin by means of a so called master batch. To prepare such a master batch, the additive is first dispersed in a carrier material. The carrier material is preferably polyester, but it may be another polymer which is compatible with polyester. The master batch is added to the polyester in the melt extruder, before film production, resulting in the components of the master batch being dissolved or finely dispersed in the polyester.

Surface Treatment

The polymeric support may be surface treated, typically to enhance the adhesion between the support and layers provided thereon.

Examples of such a surface treatment include a corona discharge treatment, a flame treatment, an UV treatment, a low pressure plasma treatment, and an atmospheric plasma treatment. A chemical treatment of the surface is also known in the art.

In a corona discharge treatment, typically high frequency and high voltage electricity is applied between a metal roll coated with a dielectric substance and insulated electrodes to induce ionization of the air between the electrodes, i.e. a corona discharge. A corona discharge treatment of the support is performed by passing the support through the corona discharge. Coronization may also been performed in modified atmospheric conditions.

For example, a gap distance between the electrodes and the dielectric roll may be from 1 to 3 mm, a frequency of 1 to 100 kHz, and an applied energy of 0.2 to 5 kV·A·min/m$^2$ may be used.

In a flame treatment, the outer flame portion of a flame is brought into contact with the support. Care has to be taken that the flame, uniformly hits the support surface. This may be achieved by using plural, circular-shaped burners. Examples of the combustion gas that may be used in a flame treatment include paraffin-based gases such as natural gas, methane gas, ethane gas, propane gas and butane gas, and olefin-based gases such as ethylene gas, propylene gas, and acetylene gas. These gases may be used singly, or as mixtures of two or more gases. Oxygen or air is preferably used as an oxidizing gas that is mixed with the combustion gas.

A flame treatment as disclosed in US2011/0284075, paragraph [0247] to [0258] is preferably used to optimize the surface energy of the polymeric support.

In an UV treatment, the surface of a support is irradiated with UV radiation to improve its adhesiveness and wettability. Typically, a low pressure mercury UV lamp is used as an UV radiation source. Preferably UV radiation at 254 nm, more preferably at 185 nm is used in such a UV treatment. The UV treatment is typically carried out for 1 to 500 seconds under atmospheric pressure.

In a low pressure plasma treatment, the surface of the support is treated with plasma, generated as a result of a discharge in a gas, the plasma gas, in a low pressure atmosphere. Examples of plasma gas that may be used include oxygen gas, nitrogen gas, water vapor gas, argon gas and helium gas. Preferably oxygen, or a mixed gas of oxygen gas and argon gas, are used. The pressure of the plasma gas is preferably in the range of 0.005 to 10 Torr, more preferably in the range of 0.008 to 3 Torr. The plasma output power is preferably from 100 to 2500 W, more preferably from 500 to 1500 W. The treatment time is preferably from 0.05 to 100 seconds, more preferably from 0.5 to 30 seconds. The plasma may be generated using a direct current glow discharge, a high frequency wave discharge, or a microwave discharge.

In an atmospheric pressure plasma treatment, a stable plasma discharge is generated at atmospheric pressure using high frequency waves. Argon gas or helium gas may be used as carrier gas. Oxygen gas may be mixed with the carrier gas. The atmospheric pressure plasma treatment is preferably carried out at atmospheric pressure or a pressure close to or below the atmospheric pressure, such as between 500 and 800 Torr. The power supply frequency of the discharge is preferably 1 to 100 kHz, more preferably 1 to 10 kHz. The discharge intensity is preferably from 50 to 500 W·min/m$^2$.

Primer to the Weather Resistant Layer

A primer (12) may be provided between the polymeric support (10) and the weather resistant layer (13) to improve the adhesion between both.

The thickness of such a primer is preferably less than 2 μm, more preferably between 0.05 and 2.00 μm, even more preferably between 0.1 and 1.50 μm.

The primer may contain a binder, for example polyesters, polyurethanes, acrylic resins, or polyolefins. Apart from the binder, the primer may also contain compounds selected from epoxy compounds, isocyanate compounds, melamine compounds, carbodiimide compounds and oxazoline compounds, a surfactant selected from anionic and nonionic surfactants, or a filler, such as silica.

The coating method for the primer may be any conventional coating method, for example a gravure coater of a bar coater may be used.

The coating solvent of the coating solution may be water or an organic solvent such as toluene or MEK. One or more solvents may be used singly or in combination.

The coating solution may be applied on the polymeric support before or after the support has been biaxially stretched or, more preferably, in between the lateral and longitudinal stretching.

Solar Cell Module

FIG. 1 schematically represents an embodiment of a photovoltaic module according to the present invention.

The solar cell module (5) has a configuration in which a solar cell element (3), which converts the light energy of sunlight to electrical energy, is disposed between a transparent sheet (4) through which sunlight enters (also referred to as the front sheet) and the backsheet (1) according to a preferred embodiment of the present invention. The solar cell element (3) is encapsulated by an encapsulant or sealing layer (2, 2').

Such a solar cell module is typically prepared by laminating all components, i.e. backsheet, front sheet, encapsulant sheets and the solar cell element, in one step.

A preferred embodiment of a backsheet (1) according to the present invention is schematically represented in FIG. 2.

The backsheet (1) comprises a polymeric support (10), on one side of the support an optional primer (12) and a weather resistant layer (13), and a primer (11) on the other side of the support to enhance the adhesion towards an encapsulant layer (2').

To simplify the assembly of a solar cell module by the module manufacturer, it may be preferred to integrate the backsheet (1) and the encapsulant layer (2').

Such an integration may have a positive influence on the cost price of the solar cell module.

FIG. 3 schematically represents an embodiment wherein the backsheet according to the present invention (1) is integrated with an encapsulant layer (2'). The encapsulant layer (2') may be applied to the backsheet (1) by a laminating an encapsulant layer on the backsheet or by extrusion coating an encapsulant layer on the backsheet.

EXAMPLES

Materials

All materials used in the examples were readily available from standard sources such as Aldrich Chemical Co. (Belgium) and Acros (Belgium) unless otherwise specified.

HH UV-G 13, HALSHYBRID UV-G 13, a 42 wt % dispersion of an acrylic resin in ethylacetate from NIPPON SHOKUBAI.
DESMODUR N3300, an aliphatic polyisocyanate (oligomer containing HDI trimer) from BAYER.
EVA encapsulant from NOVOPOLYMER.
Cyclohexylmethacrylate min. 98.0% was obtained from BASF, Ludwigshafen, Germany.
RUVA-93, a polymerizable UV absorber, was obtained form OTSUKA CHEMICAL CO. It has the following chemical structure

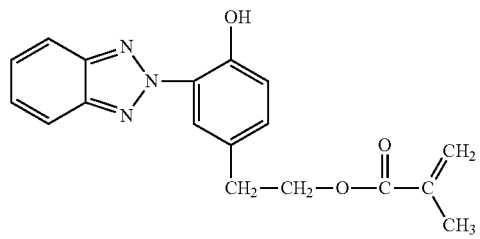 [SMILES: C=C(C)C(=O)OCCc1ccc(O)c(-n2nc3ccccc3n2)c1]

ADK Stab LA-87, a polymerizable HALS compound, was obtained from ADEKA PALMAROLE.
Wako V601, an initiator from WAKO.
HEMA, hydroxyethylmethacrylate.
SCA-403, an epoxy silane from ITOCHU.
Geniosil® GF 31, 3-methacryloxypropyltrimethoxysilane from WACKER.
Silquest*A-1100 from MOMENTIVE.

Example 1

Synthesis of the Acrylic Resin AR-01 to AR-15

All acrylic resins were prepared according to the same reaction procedure but with different comonomer ratios.

The solution polymerisations were preformed in a STEM RS600 parallel reactor (from Electrothermal). The copolymerizations were performed at high concentrations (±70 wt %) to obtain a high monomer conversion due to the Trommsdorffs-Norrish or Gel effect. After the copolymerization, the reaction mixtures were diluted to obtain a 40 wt % solution.

The comonomers used were cyclohexylmethacrylate (CHMA), butylacrylate (BuA), hydroxyethylmethacrylate (HEMA), RUVA-93, ADK Stab LA-87. The total amount of comonomers was always 70 g. The relative amounts of the different comonomers (in wt %) used for the different acrylic resins are given in Table 2.

TABLE 2

|       | CHME | BUA  | HEMA | RUVA-93 | ADK Stab LA-87 |
|-------|------|------|------|---------|----------------|
| AR-01 | 77.8 | 22.2 | 0.0  | —       | —              |
| AR-02 | 90.0 | 10.0 | 0.0  | —       | —              |
| AR-03 | 75.0 | 20.0 | 5.0  | —       | —              |
| AR-04 | 70.0 | 20.0 | 10.0 | —       | —              |
| AR-05 | 67.0 | 16.0 | 5.0  | 10.0    | 2.0            |
| AR-06 | 63.0 | 15.0 | 10.0 | 10.0    | 2.0            |
| AR-07 | 48.0 | 20.0 | 20.0 | 10.0    | 2.0            |
| AR-08 | 73.0 | 20.0 | 5.0  | —       | 2.0            |
| AR-09 | 63.0 | —    | 5.0  | 30.0    | 2.0            |
| AR-10 | 80.4 | 7.6  | 10.0 | —       | 2.0            |
| AR-11 | 63.0 | 20.0 | 10.0 | 5.0     | 2.0            |
| AR-12 | 58.0 | —    | 10.0 | 30.0    | 2.0            |
| AR-13 | 83.0 | —    | 10.0 | 5.0     | 2.0            |
| AR-14 | 68.0 | —    | 20.0 | 10.0    | 2.0            |
| AR-15 | 58.0 | 7.5  | 7.5  | 18.0    | —              |

The comonomers and 19.88 grams of ethylacetate were added to the 250 ml reactors of the STEM RS600 parallel reactor. The reactors were then placed into the STEM RS600 parallel reactor and flushed with nitrogen. After 1 hour the reactor was heated to 75° C. and subsequently the initiator solution, i.e. a solution of 12.31 g of Wako V601 in 12.65 ml ethylacetate, was dosed in 2 hours. Due to exothermic heat produced during the copolymerisation reaction the temperature of the reaction mixture reaches 84° C. When the temperature of the reaction mixture drops to ±80° C., the mixture is kept at that temperature during 6 hours. Then, the polymerisation mixture is allowed to cool down to room temperature over night.

The next day the reaction mixture is heated again to 60° C., diluted to a theoretical solids content of 40 wt % and mixed homogenously using a stirrer. The solution is then transferred to a bottle and further homogenized on a roller bench. Then the solid content is determined and adjusted to exactly 40 wt %.

Example 2

Preparation of 10 wt % Desmodur N3300 in Ethyl Acetate 5.0 g of Desmodur N3300 was mixed with 45.0 g ethyl acetate in a 100 mL conical flask and stirred for 5 minutes.
Preparation of the Coating Solutions 6.0 g of the acrylic resins were transferred, 5.0 of the 10 wt % solution of Desmodur N3300 in ethyl acetate and 84.0 g of ethyl acetate were transferred with a pasteur pipette into a conical flask and stirred for 10 minutes.

All mixtures were made at room temperature (~20° C.). The coating solutions were left for no longer than 1 hour before coating.
Coating A corona treated PET foil (250 μm) was placed on a heated coating table (45° C. and secured by a clip. The coating solutions were coated using a wire bar (coating thickness was 26 μm) on the PET substrate. The coatings were dried with hot air and then placed in an oven for pre-curing at 90° C. during 10-15 minutes. After that, the samples were vertically hung in a second oven, overnight at 90° C. (±15 hours).

Two coatings were made for each coating solution.
The composition of the coatings are given in Table 2.

TABLE 2

| Ingredients (g/m²) | COMP-01 | COMP-02 | COMP-03 | COMP-04 | INV-01 |
|--------------------|---------|---------|---------|---------|--------|
| AR-01              | 0.5     | —       | —       | —       | —      |
| AR-02              | —       | 0.5     | —       | —       | —      |
| AR-03              | —       | —       | 0.5     | —       | —      |
| AR-04              | —       | —       | —       | 0.5     | —      |
| AR-05              | —       | —       | —       | —       | 0.5    |
| Desmodur N3300     | 0.1     | =       | =       | =       | =      |

TABLE 2-continued

| Ingredients (g/m²) | INV-02 | INV-03 | COMP-05 | INV-04 | COMP-06 |
|---|---|---|---|---|---|
| AR-06 | 0.5 | — | — | — | — |
| AR-07 | — | 0.5 | — | — | — |
| AR-08 | — | — | 0.5 | — | — |
| AR-09 | — | — | — | 0.5 | — |
| AR-10 | — | — | — | — | 0.5 |
| Desmodur N3300 | 0.1 | = | = | = | = |

| Ingredients (g/m²) | INV-05 | INV-06 | INV-07 | INV-08 | INV-09 |
|---|---|---|---|---|---|
| AR-11 | 0.5 | — | — | — | — |
| AR-12 | — | 0.5 | — | — | — |
| AR-13 | — | — | 0.5 | — | — |
| AR-14 | — | — | — | 0.5 | — |
| AR-15 | — | — | — | — | 0.5 |
| Desmodur N3300 | 0.1 | = | = | = | = |

Lamination

Glass (3 mm thick) was cut to an appropriate size and cleaned using n-propanol and left for 24 hours to dry. The glass was then polished using a lint free cloth. EVA encapsulation material (from Novopolymers) was removed from the storage bag and cut to size, leaving unused material out in laboratory conditions for as little time as possible.

The encapsulation material was placed on the glass, followed by silicon paper and finally the PET foil, ensuring that the coated side was facing the EVA encapsulation material.

The combination of all materials is then placed inside a pre-warmed loading tray and placed inside an oven.

After lamination was completed, the samples were removed and left to cool to room temperature.

The level of adhesion of the coating within the laminate, i.e. the adhesion of the primer towards the EVA encapsulant, was determined by measuring the peel strength in accordance with ASTM D903-98(2010). The samples were left for 24 hours before the peel strength was measured.

The peel strength of the samples measured with an Instron 33R49 apparatus is given in Table 3.

TABLE 3

| | Acrylic Resin | CHME | BUA | HEMA | UV | HALS | Peel strength (N/cm) |
|---|---|---|---|---|---|---|---|
| COMP-01 | AR-01 | 77.8 | 22.2 | 0.0 | — | — | 8 |
| COMP-02 | AR-02 | 90.0 | 10.0 | 0.0 | — | — | 1 |
| COMP-03 | AR-03 | 75.0 | 20.0 | 5.0 | — | — | 35 |
| COMP-04 | AR-04 | 70.0 | 20.0 | 10.0 | — | — | 47 |
| INV-01 | AR-05 | 67.0 | 16.0 | 5.0 | 10.0 | 2.0 | 65 |
| INV-02 | AR-06 | 63.0 | 15.0 | 10.0 | 10.0 | 2.0 | 67 |
| INV-03 | AR-07 | 48.0 | 20.0 | 20.0 | 10.0 | 2.0 | 54 |
| COMP-05 | AR-08 | 73.0 | 20.0 | 5.0 | — | 2.0 | 46 |
| INV-04 | AR-09 | 63.0 | — | 5.0 | 30.0 | 2.0 | 89 |
| COMP-06 | AR-10 | 80.4 | 7.6 | 10.0 | — | 2.0 | 45 |
| INV-05 | AR-11 | 63.0 | 20.0 | 10.0 | 5.0 | 2.0 | 57 |
| INV-06 | AR-12 | 58.0 | — | 10.0 | 30.0 | 2.0 | 91 |
| INV-07 | AR-13 | 83.0 | — | 10.0 | 5.0 | 2.0 | 74 |
| INV-08 | AR-14 | 68.0 | — | 20.0 | 10.0 | 2.0 | 88 |
| INV-09 | AR-15 | 58.0 | — | 10.0 | 30.0 | 2.0 | 91 |

It is clear from Table 3 that the inventive examples, wherein an acrylic resin prepared with at least 2 wt % of an acrylate monomer containing a crosslinkable group and at least 5.0 wt % of an acrylate monomer containing an UV absorbing group, both relative to the total amount of acrylic monomers, is used have a better adhesion towards the EVA encapsulant.

Example 3

This example shows the influence of silane compounds on the adhesion of the primer towards the encapsulant layer.

The coatings were performed as in Example 2. The composition of the coatings are given in Table 4.

TABLE 4

| Ingredients (g/m²) | INV-10 | INV-11 | INV-12 | INV-13 | INV-14 | INV-15 |
|---|---|---|---|---|---|---|
| HH UV-G 13 | 0.5 | = | = | = | = | = |
| Desmodur N3300 | 0.1 | = | = | = | = | = |
| SCA-403 | — | 0.025 | — | — | — | — |
| SCA-403 | — | — | 0.050 | — | — | — |
| Geniosil ® GF 31 | — | — | — | 0.025 | — | — |
| Geniosil ® GF 31 | — | — | — | — | 0.050 | — |
| Silquest* A-1100 | — | — | — | — | — | 0.025 |

These coatings were laminated to an EVA encapsulant as described in Example 2.

The adhesion between the primer and the encapsulant was evaluated by measuring the peel strength as described in Example 2. The peel strength was now evaluated after 500 hours Damp Heat Test (DHT) wherein the samples are kept for 500 hours at a temperature of 85° C. and a Relative Humidity (RH) of 85%. The peel strength results are shown in Table 5.

TABLE 5

| | Silane compound | | Peel strength (N/cm) |
|---|---|---|---|
| INV-10 | — | — | 47 |
| INV-11 | SCA-403 | 25 mg/m² | 75 |
| INV-12 | SCA-403 | 50 mg/m² | 93 |
| INV-13 | Geniosil ® GF 31 | 25 mg/m² | 79 |
| INV-14 | Geniosil ® GF 31 | 50 mg/m² | 85 |
| INV-15 | Silquest* A-1100 | 25 mg/m² | 64 |

HH UV-G 13 is commercially available acrylic resin according to the present invention.

It is clear from Table 5 that the addition of a silane compound to the primer further improves the adhesion of the support to the EVA encapsulant layer.

The invention claimed is:

1. A backsheet for a photovoltaic module, the backsheet comprising:
    a support; and
    a primer provided on a first side of the support facing a sealing layer, the primer including an acrylic resin and a crosslinking agent; wherein
    the acrylic resin is a copolymer including at least 5 wt % of an acrylate monomer unit including a UV absorbing group and at least 2 wt % of an acrylate monomer unit including a crosslinkable group, each relative to a total weight of monomer units in the acrylic resin.

2. The backsheet according to claim 1, wherein the crosslinkable group is a hydroxyl group.

3. The backsheet according to claim 1, wherein the UV absorbing group is a benzothiazolylidene derivative.

4. The backsheet according to claim 1, wherein the acrylic resin includes at least 40 wt % of an alicylic acrylate monomer unit.

5. The backsheet according to claim 1, wherein the acrylic resin includes an acrylate monomer unit including a HALS group.

6. The backsheet according to claim 1, wherein the crosslinking agent is a polyisocyanate compound.

7. The backsheet according to claim 1, wherein the primer includes a silane compound.

8. The backsheet according to claim 7, wherein an amount of the silane compound is between 5 mg/m$^2$ and 500 mg/m$^2$.

9. The backsheet according to claim 1, further comprising a weather resistant layer provided on a second side of the support, wherein the weather resistant layer includes a binder including a crosslinkable group and a crosslinking agent.

10. The backsheet according to claim 9, wherein the binder is selected from a fluoropolymer and an acrylic resin.

11. The backsheet according to claim 10, wherein the binder includes both the fluoropolymer and the acrylic resin, and a weight ratio of the fluoropolymer to the acrylic resin is at least 4.0.

12. A solar cell module comprising:
the backsheet as defined in claim 1.

13. An integrated backsheet comprising:
the backsheet as defined in claim 1; and
an encapsulant layer.

14. A method for preparing the backsheet as defined in claim 9, the method comprising the steps of:
providing the support;
applying the primer layer on the first side of the support; and
applying the weather resistant layer on the second side of the support.

15. The method according to claim 14, wherein the primer and the weather resistant layer are applied on the support from an aqueous or a non-aqueous coating solution.

* * * * *